(12) United States Patent
Subramanian et al.

(10) Patent No.: US 10,037,395 B2
(45) Date of Patent: Jul. 31, 2018

(54) SYSTEMS AND METHODS FOR IMPROVING BATTERY PERFORMANCE

(71) Applicant: Washington University, St. Louis, MO (US)

(72) Inventors: Venkat Subramanian, St. Louis, MO (US); Venkatasailanathan Ramdesigan, Mumbai (IN); Paul Northrop, St. Louis, MO (US); Sumitava De, St. Louis, MO (US); Bharat Kumar Suthar, St. Louis, MO (US); Matthew Lawder, St. Louis, MO (US)

(73) Assignee: Washington University, St. Louis, MO (US)

( * ) Notice: Subject to any disclaimer, the term of this patent is extended or adjusted under 35 U.S.C. 154(b) by 1085 days.

(21) Appl. No.: 14/079,490

(22) Filed: Nov. 13, 2013

(65) Prior Publication Data

US 2014/0136169 A1    May 15, 2014

Related U.S. Application Data

(60) Provisional application No. 61/725,572, filed on Nov. 13, 2012.

(51) Int. Cl.
*G06F 7/60* (2006.01)
*G06F 17/10* (2006.01)
*G06F 17/50* (2006.01)

(52) U.S. Cl.
CPC .............................. *G06F 17/5036* (2013.01)

(58) Field of Classification Search
CPC ..................... G06F 17/5009; G06F 17/5036
USPC .............................................................. 703/2
See application file for complete search history.

(56) References Cited

U.S. PATENT DOCUMENTS

2012/0130692 A1* 5/2012 Li .......................... H01M 10/00
                                                                 703/2
2014/0002031 A1* 1/2014 Chaturvedi ........... H01M 10/44
                                                                 320/152

OTHER PUBLICATIONS

Subramanian et al. "Mathematical Model Reformulation for Lithium-Ion Battery Simulations: Galvanostatic Boundary Conditions". Journal of the Electrochemical Society, 156 (4). 2009. p. A260-A271.*

(Continued)

*Primary Examiner* — Eunhee Kim
(74) *Attorney, Agent, or Firm* — Armstrong Teasdale LLP

(57) ABSTRACT

A computer-implemented method for modeling the amount of current discharged by a battery is provided. The method is implemented by a computing device communicatively coupled with a memory, and includes generating, by the computing device, a model of at least one battery cell comprising a positive electrode region, a negative electrode region, and a separator region. The method also includes transforming the positive electrode region, the negative electrode region, and the separator region of the battery into a single region in the model. In addition, the method includes generating, by the computing device, a plurality of trial functions associated with the single region, and determining, by the computing device, the amount of current discharged from the battery cell based on the trial functions.

20 Claims, 10 Drawing Sheets

(56) References Cited

OTHER PUBLICATIONS

P. W. C. Northrop, et al., "Coordinate Transformation, Orthogonal Collocation, Model Reformulation and Simulation of Electrochemical-Thermal Behavior of Lithium-Ion Battery Stacks," Journal of the Electrochemical Society, vol. 158, p. A1461, 2011.

P. Arora, et al., "Mathematical modeling of the lithium deposition overcharge reaction in lithium-ion batteries using carbon-based negative electrodes," Journal of the Electrochemical Society, vol. 146, p. 3543, 1999.

M. Doyle, et al., "Modeling of Galvanostatic Charge and Discharge of the Lithium Polymer Insertion Cell," Journal of the Electrochemical Society, vol. 140, pp. 1526-1533, Jun. 1993.

M. Doyle and J. Newman, "The use of mathematical modeling in the design of lithium/polymer battery systems," Electrochimica Acta, vol. 40, pp. 2191-2196, 1995.

T. F. Fuller, et al., "Simulation and optimization of the dual lithium ion insertion cell," Journal of the Electrochemical Society, vol. 141, p. 1, 1994.

N. A. Chaturvedi, et al., "Modeling, estimation, and control challenges for lithium-ion batteries," 2010, pp. 1997-2002.

N. A. Chaturvedi, et al., "Algorithms for advanced battery-management systems," Control Systems Magazine, IEEE, vol. 30, pp. 49-68, 2010.

D. Di Domenico, et al., "Lithium-ion battery state of charge estimation with a kalman filter based on a electrochemical model," 2008, pp. 702-707.

D. Di Domenico, et al., "Lithium-ion battery state of charge and critical surface charge estimation using an electrochemical model-based extended Kalman filter," Journal of Dynamic Systems, Measurement, and Control, vol. 132, p. 061302, 2010.

R. Klein, et al., "State estimation of a reduced electrochemical model of a lithium-ion battery," 2010, pp. 6618-6623.

R. Klein, et al., "Optimal charging strategies in lithium-ion battery," 2011, pp. 382-387.

R. Klein, et al., "Electrochemical Model Based Observer Design for a Lithium-Ion Battery," 2012.

S. Moura, et al., "PDE Estimation Techniques for Advanced Battery Management Systems—Part I: SOC Estimation," 2012.

S. Moura, et al., "PDE Estimation Techniques for Advanced Battery Management Systems—Part II: SOH Identification," 2012.

\* cited by examiner

SYSTEMS AND METHODS FOR IMPROVING BATTERY PERFORMANCE

CROSS-REFERENCE TO RELATED APPLICATIONS

This application claims the benefit of U.S. Provisional Application No. 61/725,572 filed Nov. 13, 2012, which is incorporated herein by reference in its entirety.

STATEMENT REGARDING FEDERALLY SPONSORED RESEARCH & DEVELOPMENT

This invention was made with government support under grant DEAR0000275 and CBET1008692 awarded by the National Science Foundation. The U.S. government has certain rights in the invention.

BACKGROUND

The present disclosure relates generally to improving battery performance by modeling the discharge behavior of a battery, and more specifically, to improving battery performance by efficiently modeling the discharge behavior of a battery using a coordinate transformation and collocation method.

Mathematical modeling and simulation of the operation of lithium ion batteries is not trivial, as concentration and potential fields must be evaluated simultaneously in both solid and liquid phases. This is complicated by the fact that the transport and kinetic parameters which determine battery behavior are highly nonlinear, leading to very complex governing equations. A general model based on concentrated solution theory to describe the internal behavior of a lithium-ion sandwich consisting of positive and negative porous electrodes, a separator, and current collectors has been developed. However, the general model is based on a number of difficult to solve equations that may take several minutes to solve.

For analysis and control of lithium-ion batteries in hybrid environments (e.g. with a fuel cell, capacitor, or other electrical components), there is a need to simulate state of charge, state of health, and other parameters of lithium-ion batteries in milliseconds. Full-order physics-based models may simulate discharge curves in several seconds to minutes, depending on the solvers, routines, computers, etc. In contrast, empirical models (based on correlations of past data) can simulate specific operating scenarios in milliseconds. However, use of these models under a different operating condition than for which they were developed may cause abuse or underutilization of electrochemical power sources, leading to significant errors.

The porous electrode model is a physics-based first principles model that describes the behavior of a 1-D battery subject to isothermal conditions. This is a system of ten partial differential equations (PDEs) in one linear coordinate, x, the radial coordinate, r, and the temporal coordinate, t, which must be solved simultaneously. The first equation is derived from concentrated solution theory and material balances. The second equation is the charge balance in the liquid phase while the third equation is the charge balance in the solid phase. The fourth equation is Fick's law of diffusion inside the solid particles (solid phase). These equations must be applied to each region of a battery cell individually, while noting that there is no active solid phase in the separator region.

In order to simplify the model, the radial dependence of the solid phase concentration can be eliminated by using a polynomial profile approximation. Rather than representing the solid phase concentration as a continuous function of x, r and t, the solid phase is represented by the particle surface concentration and the particle average concentration, both of which are functions of the linear spatial coordinate and time only. This type of volume-averaging combined with the polynomial approximation has been shown to be accurate for low to medium rates of discharge. This step eliminates some of the equations required in the model and removes the variable r from the equations, but increases the total number of equations to 12. Each of the equations that must be solved across the three regions: the positive electrode region, the negative electrode region, and the separator region. The mixed finite difference approach is known for simulation of discharge rates greater than 1 C. The mixed finite difference approach uses 6 optimally spaced node points (with 6 corresponding governing equations) to describe the behavior of the lithium ion concentration in the radial direction within the solid phase particles. This is in contrast to the polynomial profile approximation, which relies on 2 governing equations to describe the solid phase concentration. This allows the mixed finite difference approach to better capture the dynamics within the electrode at high rates, though at the cost of additional computation time. Typically, numerical approaches are used to solve these equations. The first of these solution approaches have included discretization in both space and time. Recently, discretization in space alone has been used by few researchers in order to take advantage of the speed gained by time-adaptive solvers such as DASSL for the time coordinate. This reduces the system of PDEs to a system of differential algebraic equations (DAEs) of index 1 with time as the only independent variable. However, this results in a very large number of nonlinear DAEs to be solved when a finite difference scheme is used. Assume that 50 equally spaced node points in the linear length scale (i.e. in x) are used to discretize each of the cathode, separator, and anode. The cathode now has 50 ordinary differential equations for both the electrolyte concentration and solid-phase average concentration, and 50 algebraic equations for the potential in both the electrolyte and solid phase as well as for the solid-phase surface concentration. This results in a system of 250 DAEs for the cathode. The anode is discretized in the same manner resulting in 250 additional DAEs. Since there is no active solid phase in the separator, using 50 node points will result in 50 differential equations for the electrolyte concentration and 50 algebraic equations for the electrolyte potential, for a total of 100 DAEs to describe this region. Thus, the total number of DAEs to be solved for the full-order model across the entire cell is 250+250+100=600 DAEs.

Given the large number of DAEs that must be solved, the full order spatial discretization is slow and computationally inefficient. These inefficiencies are compounded when used for control or optimization, which require fast simulation to be used effectively. Therefore it is not ideal to use a direct full order finite difference approach for these purposes. There have been many approaches to simplify the battery model for efficient evaluation while attempting to maintain a high degree of accuracy. Proper orthogonal decomposition (POD) uses the full numerical solution to fit a reduced set of eigenvalues and nodes to get a meaningful solution with a reduced number of equations. However, this method requires rigorous numerical solutions to build the POD reduced-order models. Also, once the operating condition is changed, the boundary conditions are modified, or if the parameter values are adjusted significantly, the POD model needs to be reconstructed.

In addition, a reformulated pseudo 2-D porous electrode model for galvanostatic boundary conditions has been developed. That model provided an efficient method to solve battery models in milliseconds without using a reduced order model that potentially sacrifices accuracy. This approach has proven to be useful for isothermal models, but has difficulties when non-linear properties and thermal effects are considered. The integral calculation required for Galerkin collocation becomes particularly complicated when the diffusion coefficient of the electrolyte phase is nonlinear.

Accordingly, there is a need in the art for a computationally efficient and robust method of modeling battery parameters.

BRIEF DESCRIPTION

In one aspect, a computer-implemented method for modeling the amount of current discharged by a battery is provided. The method is implemented by a computing device communicatively coupled with a memory, and includes generating, by the computing device, a model of at least one battery cell comprising a positive electrode region, a negative electrode region, and a separator region. The method also includes transforming the positive electrode region, the negative electrode region, and the separator region of the battery into a single region in the model. In addition, the method includes generating, by the computing device, a plurality of trial functions associated with the single region, and determining, by the computing device, the amount of current discharged from the battery cell based on the trial functions.

In another aspect, a computing device for modeling the discharge current from a battery is provided. The computing device includes a memory and a processor communicatively coupled to the memory, wherein the processor is configured to generate a model of at least one battery cell comprising a positive electrode region, a negative electrode region, and a separator region. The processor is further configured to transform the positive electrode region, the negative electrode region, and the separator region into a single region. In addition, the processor is configured to generate a plurality of trial functions associated with the single region, and determine the amount of current discharged from the battery cell based on the trial functions.

In yet another aspect, a battery management system for improving performance of a battery is provided. The battery management system includes a battery comprising at least one battery cell, a battery sensor coupled to the battery and configured to measure parameters associated with the battery, and a computing device communicatively coupled with the battery sensor. The computing device is configured to generate a model of at least one battery cell comprising a positive electrode region, a negative electrode region, and a separator region. The computing device is further configured to transform the positive electrode region, the negative electrode region, and the separator region into a single region in the model. The computing device is further configured to generate a plurality of trial functions associated with the single region, and determine the amount of current discharged from the battery cell based on the trial functions.

DRAWINGS

These and other features, aspects, and advantages of the present disclosure will become better understood when the following detailed description is read with reference to the accompanying drawings in which like characters represent like parts throughout the drawings, wherein.

Figure 1:
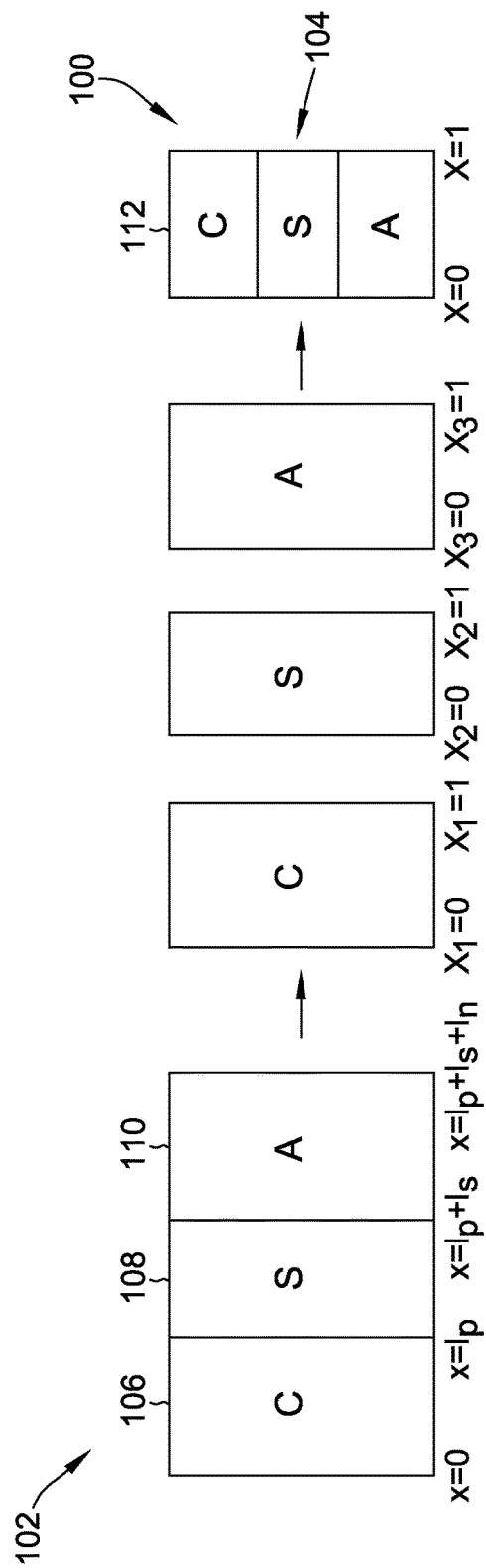
FIG. 1 is a schematic view of an exemplary battery cell being transformed from a standard three region model to a single region model to improve computational efficiency.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

A battery management system and methods of modeling a battery discharge using a coordinate transformation combined with an orthogonal collocation reformulation for the simulation of lithium ion battery operation are provided. The reformulation is designed to be computationally easier to implement and efficient while maintaining the fidelity of the physics based model on which it is based.

This reformulation will achieve the goal of being computationally efficient by substantially reducing the number of DAEs that must be solved. Also, the coordinates will be transformed so that each region (a positive electrode, i.e., cathode, region, a negative electrode, i.e., anode, region, and a separator region) is a function of a dummy variable X in the domain [0, 1]. Following this, the remaining equations are discretized in X by using orthogonal collocation. This approach converges much faster than finite difference, thereby requiring fewer terms to obtain a meaningful result. Once this is done, the system of equations will be examined to eliminate any variable that can be solved for in terms of the other variables. The physics of the system are maintained by limiting the assumptions made during the reformulation.

The coordinate transformation used in this reformulation enables the extension of the model for a single cell sandwich to a multicell stack. The robustness of the proposed reformulation is shown by simulating an electrochemical thermal coupled multi-cell stack model. The inclusion of temperature increases the computational load by adding an additional dependent variable and including non-constant and non-linear parameters in the model. This thermal simulation is performed in context of a multi-cell battery stack to show the effects that an applied temperature gradient has on individual cells in a stack.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Orienting language, as used herein throughout the specification and the claims, is solely used to facilitate the description of elements with respect to each other, and does not define their orientation with respect to any other frame of reference. Accordingly, elements modified by terms such as "top" and "bottom" may be oriented in any other direction with respect to an outside frame of reference unless the context or language clearly indicates otherwise.

Furthermore, references to one "implementation" or one "embodiment" of the subject matter described herein are not intended to be interpreted as excluding the existence of additional implementations that also incorporate the recited features.

FIG. 1 is a schematic view of an exemplary battery cell 100 being transformed from a standard three region model to a single region model to improve computational efficiency. It should be noted that the untransformed battery cell 102 has the three regions defined sequentially and the transformed battery cell 104 has a single region. In other words, the equations for a positive electrode 106 are defined on the region [0, lp], the equations for a separator 108 are defined on the region [lp, lp+ls], and the equations for a negative electrode 110 are defined on the region [lp+ls, lp+ls+ln]. In order to decrease the required computation, each region is rescaled to a domain of [0, 1] in transformed battery cell 104. This effectively reduces the problem from three regions to a single region.

From the equations of the physics based model, shown in Table I, the electrolyte concentrations can be converted from the three region cell 102 to a single region 112 by transforming the spatial coordinate x to the dimensionless coordinates $X_1$, $X_2$, and $X_3$ in the anode 110, separator 108, and cathode 106, respectively. These transformations are achieved using the following equations:

$$X_1 = \frac{x}{l_p} \tag{1}$$

$$X_2 = \frac{x - l_p}{l_s} \tag{2}$$

$$X_3 = \frac{x - l_p - l_s}{l_n} \tag{3}$$

By applying the coordinate transformation expressed in equations 1 to 3 to the governing equations of the physics model shown in Table I, the transformed governing equations shown in Table II are derived.

TABLE I

| Governing Equations for Li-Ion Batteries Governing Equations | |
|---|---|
| Boundary | Conditions |
| Positive Electrode | |
| $\varepsilon_p \frac{\partial c}{\partial t} = \frac{\partial}{\partial x}\left[D_{\mathit{eff},p}\frac{\partial c}{\partial x}\right] + a_p(1-t_+)j_p$ | $\left.\frac{\partial c}{\partial x}\right|_{x=0} = 0$ |
| | $-D_{\mathit{eff},p}\frac{\partial c}{\partial x}\bigg|x = l_p^- = D_{\mathit{eff},s}\frac{\partial c}{\partial x}\bigg|_{x=l_p^+}$ |
| $-a_{\mathit{eff},p}\frac{\partial \Phi_1}{\partial x} - \kappa_{\mathit{eff},p}\frac{\partial \Phi_2}{\partial x} + \frac{2\kappa_{\mathit{eff},p}RT}{F}(1-t_+)\frac{\partial \ln c}{\partial x} = I$ | $\left.\frac{\partial \Phi_2}{\partial x}\right|_{x=0} = 0$ |
| | $-\kappa_{\mathit{eff},p}\frac{\partial \Phi_2}{\partial x}\bigg|x = l_p^- = -\kappa_{\mathit{eff},s}\frac{\partial \Phi_2}{\partial x}\bigg|_{x=l_p^+}$ |
| $\frac{\partial}{\partial x}\left[\sigma_{\mathit{eff},p}\frac{\partial \Phi_1}{\partial x}\right] = a_p F j_p$ | $\left.\frac{\partial \Phi_1}{\partial x}\right|_{x=0} = -\frac{I}{\sigma_{\mathit{eff},p}}$ |
| | $\left.\frac{\partial \Phi_1}{\partial x}\right|_{x=l_p^-} = 0$ |

TABLE I-continued

Governing Equations for Li-Ion Batteries Governing Equations

| Boundary | Conditions |
|---|---|
| $\dfrac{\partial c_p^x}{\partial t} = \dfrac{1}{r^2}\dfrac{\partial}{\partial r}\left[r^2 D_p^s \dfrac{\partial c_p^x}{\partial r}\right]$ | $\left.\dfrac{\partial c_p^x}{\partial r}\right|_{r=0} = 0$ |
| | $\left.\dfrac{\partial c_p^s}{\partial r}\right|_{r=\kappa_p} = -j_p D_p^s$ |

Separator

| | |
|---|---|
| $\varepsilon_n \dfrac{\partial c}{\partial t} = \dfrac{\partial}{\partial x}\left[D_{e\!f\!f,s}\dfrac{\partial c}{\partial x}\right]$ | $c\,\|_{x=l_p^-} = c\,\|_{x=l_p^+}$ |
| | $c\,\|_{x=l_p+l_s^-} = c\,\|_{x=l_p+l_s^+}$ |
| $-\kappa_{e\!f\!f,s}\dfrac{\partial \Phi_2}{\partial x} + \dfrac{2\kappa_{e\!f\!f,s}RT}{F}(1-t_+)\dfrac{\partial \ln c}{\partial x} = I$ | $\Phi_2\,\|_{x=l_p^-} = \Phi_2\,\|_{x=l_p^+}$ |
| | $\Phi_2\,\|_{x=l_p+l_s^-} = \Phi_2\,\|_{x=l_p+l_s^-}$ |

Negative Electrode

| | |
|---|---|
| $\varepsilon_n \dfrac{\partial c}{\partial t} = \dfrac{\partial}{\partial x}\left[D_{e\!f\!f,n}\dfrac{\partial c}{\partial x}\right] + a_n(1-t_+)j_n$ | $\left.\dfrac{\partial c}{\partial x}\right|_{x=l_p+l_x+l_n} = 0$ |
| | $-D_{e\!f\!f,x}\left.\dfrac{\partial c}{\partial x}\right|_{x=l_p+l_s^-} = -D_{e\!f\!f,n}\left.\dfrac{\partial c}{\partial x}\right|_{x=l_p+l_x^+}$ |
| $-\sigma_{e\!f\!f,n}\dfrac{\partial \Phi_1}{\partial x} - \kappa_{e\!f\!f,n}\dfrac{\partial \Phi_2}{\partial x} + \dfrac{2\kappa_{e\!f\!f,n}RT}{F}(1-i_+)\dfrac{\partial \ln c}{\partial x} = I$ | $\Phi_2\,\|_{x=l_p+l_s+l_n} = 0$ |
| | $-\kappa_{e\!f\!f,x}\left.\dfrac{\partial \Phi_2}{\partial x}\right|_{x=l_p+l_s^-} = -\kappa_{e\!f\!f,p}\left.\dfrac{\partial \Phi_2}{\partial x}\right|_{x=l_p+l_s^+}$ |
| $\dfrac{\partial}{\partial x}\left[\sigma_{e\!f\!f,n}\dfrac{\partial \Phi_1}{\partial x}\right] = a_n F j_n$ | $\left.\dfrac{\partial \Phi_1}{\partial x}\right|_{x=l_p+l_s^-} = 0$ |
| | $\left.\dfrac{\partial \Phi_1}{\partial x}\right|_{x=l_p+l_x+l_n} = -\dfrac{I}{\sigma_{e\!f\!f,n}}$ |
| $\dfrac{\partial c_n^x}{\partial t} = \dfrac{1}{r^2}\dfrac{\partial}{\partial r}\left[r^2 D_n^x \dfrac{\partial c_n^x}{\partial r}\right]$ | |

TABLE II

Transformed Governing Equations for Li-Ion Batteries

| Governing Equation | Boundary Conditions |
|---|---|

Positive Electrode

| | |
|---|---|
| $\varepsilon_p \dfrac{\partial c_p}{\partial t} = \dfrac{1}{I_p}\dfrac{\partial}{\partial X}\left[\dfrac{D_{e\!f\!f,p}}{I_p}\dfrac{\partial c_p}{\partial X}\right] + a_p(1-t_+)j_p$ | $\left.\dfrac{\partial c_p}{\partial X}\right|_{X=0} = 0$ |
| | $\left.\dfrac{-D_{e\!f\!f,p}}{I_p}\dfrac{\partial c_p}{\partial X}\right|_{X=1} = \left.\dfrac{-D_{e\!f\!f,x}}{I_s}\dfrac{\partial c_x}{\partial X}\right|_{X=0}$ |
| $\dfrac{-\sigma_{e\!f\!f,p}}{I_p}\dfrac{\partial \Phi_{2,p}}{\partial X} - \dfrac{\kappa_{e\!f\!f,p}}{I_p}\dfrac{\partial \Phi_{2,p}}{\partial x} + \dfrac{2\kappa_{e\!f\!f,p}RT}{F}\dfrac{(1-t_+)}{I_p}\dfrac{\partial \ln c_p}{\partial x} = I$ | $\left.\dfrac{-\kappa_{e\!f\!f,p}}{I_p}\dfrac{\partial \Phi_{2,p}}{\partial X}\right|_{X=1} = \left.\dfrac{-\kappa_{e\!f\!f,x}}{I_x}\dfrac{\partial \Phi_{2,x}}{\partial X}\right|_{X=0}$ |
| $\dfrac{1}{I_p}\dfrac{\partial}{\partial X}\left[\dfrac{\sigma_{e\!f\!f,p}}{I_p}\dfrac{\partial}{\partial X}\Phi_{1,p}\right] = a_p F j_p$ | $\left.\dfrac{1}{I_p}\dfrac{\partial \Phi_{1,p}}{\partial X}\right|_{X=0} = -\dfrac{I}{\sigma_{e\!f\!f,p}}$ |

TABLE II-continued

Transformed Governing Equations for Li-Ion Batteries

| Governing Equation | Boundary Conditions |
|---|---|
| | $\left.\dfrac{\partial \Phi_{1,p}}{\partial X}\right|_{X=1} = 0$ |
| $\dfrac{\partial}{\partial t} c_p^{x,avg} = -3 \dfrac{j_p}{R_p}$ | |
| $\dfrac{D_p^s}{R_p}(c_p^{x,surf} - c_p^{x,avg}) = -\dfrac{j_p}{5}$ | |

Separator

| | |
|---|---|
| $\varepsilon_x \dfrac{\partial c_x}{\partial t} = \dfrac{1}{I_x} \dfrac{\partial}{\partial X}\left[\dfrac{D_{eff,s}}{I_x} \dfrac{\partial c_x}{\partial X}\right]$ | $c_p\|_{X=1} = c_s\|_{X=0}$ |
| | $c_s\|_{X=1} = c_n\|_{X=0}$ |
| $\dfrac{-\kappa_{eff,x}}{I_x} \dfrac{\partial \Phi_{2,s}}{\partial X} + \dfrac{2\kappa_{eff,s}RT}{F} \dfrac{(1-t_+)}{I_x} \dfrac{\partial \ln c_x}{\partial X} = I$ | $\Phi_{2,s}\|_{X=1} = \Phi_{2,n}\|_{X=0}$ |
| | $\Phi_{2,p}\|_{X=1} = \Phi_{2,s}\|_{X=0}$ |

Negative Electrode

| | |
|---|---|
| $\varepsilon_n \dfrac{\partial c_x}{\partial t} = \dfrac{1}{I_n} \dfrac{\partial}{\partial X}\left[\dfrac{D_{eff,n}}{I_n} \dfrac{\partial c_n}{\partial X}\right] + a_n(1-t_+)j_n$ | $\left.\dfrac{\partial c_n}{\partial X}\right|_{X=1} = 0$ |
| | $\left.\dfrac{-D_{eff,s}}{I_x} \dfrac{\partial c_s}{\partial X}\right|_{X=1} = \left.\dfrac{-D_{eff,n}}{I_n} \dfrac{\partial c_n}{\partial X}\right|_{X=0}$ |
| $\dfrac{-\sigma_{eff,n}}{I_n} \dfrac{\partial \Phi_{1,n}}{\partial X} - \dfrac{\kappa_{eff,n}}{I_n} \dfrac{\partial \Phi_{2,n}}{\partial X} + \dfrac{2\kappa_{eff,n}RT}{F} \dfrac{(1-t_+)}{I_n} \dfrac{\partial \ln c_n}{\partial X} = I$ | $\Phi_{2,n}\|_{X=1} = 0$ |
| | $\left.\dfrac{-\kappa_{eff,s}}{I_x} \dfrac{\partial \Phi_{2,s}}{\partial X}\right|_{X=1} = \left.\dfrac{-\kappa_{eff,p}}{I_n} \dfrac{\partial \Phi_{2,n}}{\partial X}\right|_{X=0}$ |
| $\dfrac{1}{I_n} \dfrac{\partial}{\partial X}\left[\dfrac{\sigma_{eff,n}}{I_n} \dfrac{\partial}{\partial X} \Phi_{1,n}\right] = a_n F j_n$ | $\left.\dfrac{\partial \Phi_{1,n}}{\partial X}\right|_{X=0} = 0$ |
| | $\left.\dfrac{1}{I_n} \dfrac{\partial \Phi_{1,n}}{\partial X}\right|_{X=1} = -\dfrac{I}{\sigma_{eff,n}}$ |
| $\dfrac{\partial}{\partial t} c_n^{x,avg} = -3 \dfrac{j_n}{R_n}$ | |
| $\dfrac{D_n^s}{R_n}(c_n^{x,surf} - c_n^{x,avg}) = -\dfrac{j_n}{5}$ | |

Solving the equations expressed in Table II is performed by othrogonal collocation. In order to set up a system of DAEs, the proposed reformulation discretizes the model in the x-direction while maintaining the time dependence to allow for the implementation of time-adaptive solvers. In the reformulation, each variable of interest is approximated by a summation of trial functions of the form:

$$u(X,t) = F(X,t) + \Sigma_{K=0}^{N} B_k(t) T_k(X) \quad (4)$$

Where u(X, t) is the variable of interest, Tk (X) are the chosen trial functions with homogenous boundary conditions, F(X, t) is a function chosen to satisfy the (time-dependent) boundary conditions, and Bk (t) are the coefficients of the trial functions. The only requirement of the trial functions is that they all be linearly independent. However, the choice of trial functions does affect the accuracy of the final solution, and a proper choice can improve convergence. For this model, the homogeneous trial functions are typically selected to be cosine functions while the boundary conditions are satisfied by linear and quadratic terms. Because of the coordinate transformation discussed previously, the cosine trial functions can be applied in a simple form of cos(kπX) for each variable.

The approximate form of each variable equation is given in Table III.

TABLE III

Approximate Forms of Equations

Positive Electrode $$c_p(X, t) = A_{p,c}(t)X^2 + \sum_{k=0}^{N_p} B_{p,c,k}(t)\cos(k\pi X)$$

$$\Phi_{2,p}(X, t) = A_{p,\Phi_2}(t)X^2 + \sum_{k=0}^{N_p} B_{p,\Phi_2,k}(t)\cos(k\pi X)$$

$$\Phi_{1,p}(X, t) = \frac{i_{app}I_p}{\sigma_{eff,p}}\left[\frac{1}{2}X^2 - X\right] + \sum_{k=0}^{N_p} B_{p,\Phi_1,k}(t)\cos(k\pi X)$$

$$c_p^{x,surf}(X, t) = \sum_{k=0}^{N_p} B_{p,cx,surf,k}(t)\cos(k\pi X)$$

$$c_p^{x,avg}(X, t) = \sum_{k=0}^{N_p} B_{p,cx,avg,k}(t)\cos(k\pi X)$$

Separator $$c_s(X, t) = A_{s,c,1}(t)X + A_{s,c,2}(t)X^2 + \sum_{k=0}^{N_p} B_{s,c,k}(t)\cos(k\pi X)$$

$$\Phi_{2,s}(X, t) = A_{s,\Phi_2,1}(t)X + A_{s,\Phi_2,2}(t)X^2 + \sum_{k=0}^{N_p} B_{s,\Phi_2,k}(t)\cos(k\pi X)$$

Negative Electrode $$c_n(X, t) = A_{n,c}(t)(X - 1)^2 + \sum_{k=0}^{N_p} B_{n,c,k}(t)\cos(k\pi X)$$

$$\Phi_{2,n}(X, t) = A_{n,\Phi_2}(t)(X - 1)^2 + \sum_{k=0}^{N_p} B_{n,\Phi_2,k}(t)\cos\left[\left(k + \frac{1}{2}\right)\pi X\right]$$

$$\Phi_{1,n}(X, t) = -\frac{i_{app}I_n}{\sigma_{eff,n}}\left[\frac{1}{2}X^2\right] + \sum_{k=0}^{N_p} B_{n,\Phi_1,k}(t)\cos(k\pi X)$$

$$c_n^{x,surf}(X, t) = \sum_{k=0}^{N_p} B_{p,cx,surf,k}(t)\cos(k\pi X)$$

$$c_n^{x,avg}(X, t) = \sum_{k=0}^{N_p} B_{p,cx,avg,k}(t)\cos(k\pi X)$$

The variables with non-homogeneous boundary conditions, an additional linear and/or quadratic term are added to the approximate solution to satisfy the boundary conditions. This allows the boundary conditions to be applied analytically before applying the time-adaptive DAE solver.

In the example embodiment, there are no lithium ions leaving or entering the cell sandwich 102, so the flux at both ends of the cell is set to zero. These boundary conditions are included in the original form above by choosing the linear and quadratic terms appropriately. For example, in the liquid phase concentration equation there is no linear term for the concentration of the electrolyte in the positive electrode so that the derivative is zero at current collector 212 located at X=0, while holding no such restrictions at the positive electrode 206-separator 208 interface. Similarly, the $(X-1)^2$ term accomplishes the same effect for the negative electrode 210. The equations given in Table III have been developed by considering the boundary conditions for each variable in the same manner as described above. The coefficients of the linear and quadratic terms, $A_{r,v,i}(t)$ (where r, v and i denote the region, variable, and term to which the coefficient applies), are determined by requiring that each variable be continuous at both electrode-separator interfaces, while also maintaining a continuous flux.

By applying the continuity boundary conditions, it is possible to analytically solve for these coefficients simultaneously in terms of the coefficients of the trial functions for every region and for every variable of interest. The coefficients of the trial function must also be determined in order to give the best possible approximation of the solution to the twelve governing equations. The residual of a differential equation can be used to quantitatively determine the best solution. As the residual is the deviation of an approximate solution from exactly satisfying a differential equation. For the porous electrode pseudo 2-D battery model the governing equations must be satisfied, and as such there will be 12 such residuals, obtained by applying the approximate solution to the governing equations. Since these approximations are not exact, the best way to minimize the residuals while maintaining computational efficiency must be determined. This allows an adequate number of equations to be developed in order to solve for the best possible series coefficients. Specifically, the coefficients, $B_{r,v,i}(t)$, are solved by setting the integral of the residual multiplied by a weight function to zero. Mathematically:

$$\int_v^R (B_{r,v,j}(t), X) W_{v,j}(X) dX = 0 \quad v = \Phi_1, \Phi_2, c, c^{s\,surf}, c^{s\,avg} \quad j=0 \ldots N_r \text{ and } r=p,s,n \qquad (5)$$

where $R_v(B_{r,v,i}(t), X)$ is the residual for the governing equation for variable v, $W_{v,j}(X)$ is the $j^{th}$ weight function used for variable, v, and $N_r$ is the number of cosine terms used for approximation in the $r^{th}$ region. It should be noted here that there is no requirement that the variables in different regions be approximated by the same number of terms. However, all the variables in a single region must be represented by the same number of terms. For example, if the concentration profile in the positive electrode is approximated using two cosine terms, the liquid and solid phase potentials must also be approximated by two cosine terms in the positive electrode, but the concentration profile in the separator may be represented by any number of terms.

By using the method of weighted residuals, a sufficient number of differential algebraic equations to solve for all of the time dependent coefficients can be generated. However, the form of an appropriate weighting function must be determined in order achieve reasonable computing speed. Since the integration of the weighted residuals can provide significant computational difficulties, eliminating the integral in residual equation 5 would reduce the simulation time of the battery models. Therefore, the weighting functions were selected to be Dirac Delta functions:

$$W_{v,j}(X) = \partial(X_j) \qquad (6)$$

The mean weighted residual becomes the residual evaluated at a point Xj:

$$R_v(B_{r,v,i}(t), X_j) = 0 \qquad (7)$$

The governing differential equations are exactly satisfied at these collocation points. This is called the collocation method. The location of these collocation points can have a significant impact on the accuracy of the approximation, even when the same number of points is used. The best possible approximation is found by choosing the collocation points as zeros of a specific class of orthogonal polynomials called the Jacobi polynomials, which defines the orthogonal collocation method. The Jacobi polynomials are given by the relation:

$$P_N^{\alpha,\beta}(x)=\Sigma_{k=0}^{N}(-1)(-1)^{N-k}\gamma_k x^k \quad (8)$$

Where $\gamma_0=1$ and $\gamma_i$ is given by the recurrence relation:

$$\gamma_k = \frac{N-k+1}{k}\frac{N+k+\alpha+\beta}{k+\beta}\gamma_{k-1} \quad (9)$$

For a Jacobi polynomial of order M, there are M zeros in the interval [0,1]. Since there are $N_r+1$ coefficients for each variable in each region, a Jacobi polynomial of order $N_r+1$ must be used to develop enough collocation equations. $\alpha\&\beta$ are characteristic parameters of the Jacobi polynomial. A trial and error approach found that $\alpha=\beta=0$ minimized the error of the discharge curve relative to the finite difference approach for most simulations. However, at high rates of discharge and high node points, oscillations were observed as a result of numerical instabilities. This instability was eliminated by using $\alpha=\beta=1$ for a 5 C discharge and $\alpha=\beta=2$ for a 10 C discharge.

Once the zeros are determined for the Jacobi polynomials of interest, the residual at each collocation point can be set to 0 as in Equation 7. In development of the DAEs to be used to solve for the coefficients, each governing equation must be accounted for individually so that there are as many residual equations for each governing equation as there are coefficients to be solved in that region. For instance, if the variables in the positive electrode are represented by a single cosine term, the average solid phase concentration is approximated by:

$$c_p^{s,avg}(X,t)=B_{p,c^{s,avg},0}(t)+B_{p,c^{s,avg},1}(t)\cos(\pi X) \quad (10)$$

Therefore a 2nd order Jacobi polynomial is required to find two collocation points to solve for the two unknowns, $B_{p,c^{s,avg},0}(t)$ and $B_{p,c^{s,avg},1}(t)$.

Since all variables in the positive electrode are approximated using the same number of terms, the same collocation points are used in each residual. The residuals are calculated using each of the five governing equations in the positive electrode. Since each residual is defined to be zero at two node points from the orthogonal collocation method, a system of 10 DAEs is developed to solve for the 10 unknown coefficients in the positive electrode. This must be repeated for each of the other two regions as well. In the case that each variable in all three regions are approximated by a single cosine term, there are 10 DAEs in both the positive and negative electrodes, and four DAEs in the separator for a total of 24 coupled DAEs that must be solved simultaneously.

In general terms, the dependent variables in the positive electrode, the separator, and the negative electrodes are represented by $N_p$, $N_s$, and $N_n$ cosine terms respectively. Each variable thus has $N_r+1$ coefficients that must be determined in each region, where r denotes the region, and therefore $N_r+1$ residuals must be calculated. This results in $N_r+1$ DAEs for each variable. Since there are 5 governing equations (and 5 variables) for the positive and negative electrodes and 2 governing equations in the separator a total of $5(N_p+1)+2(N_s+1)+5(N_n+1)$ DAEs that must be solved simultaneously.

These equations are functions of time only, some of which are ordinary differential equations in time, while the remaining are algebraic equations. Solving this system is not trivial, and the algebraic variables must be initialized prior to solving to ensure that the initial conditions are consistent with the governing algebraic equations, and is a reason numerical simulations often fail for battery models. Once this is done, this system can be solved any type known numerical solver. In one embodiment, the numerical solver is a time-adaptive solvers, such as DASSL or DASKR.

Once the coefficients are determined, the unknown variables are represented by continuous functions valid at any position in the cell. This is in contrast to a solution obtained using a finite difference approach in which the variable is only determined at discrete node points and would require interpolation methods to find the solution between two node points. Also, orthogonal collocation converges to a solution with an error on the order of $h^{2N}$, where N is the number of collocation points and h is the node spacing. The finite difference solution that is typically used has an error on the order of $h^2$. Although the resulting equations are more complicated when using orthogonal collocation, fewer terms are required for a meaningful solution, resulting in fewer DAEs that must be solved and a net reduction in computation time.

This proposed reformulation makes no assumptions of the form of any parameter used in any of the equations. There are no requirements that the diffusion coefficients, nor the conductivities, are constant or linear, and successful results have been obtained by using diffusion coefficients which are functions of the electrolyte concentration and temperature. This model is also versatile enough to work under galvanostatic, potentiostatic, and constant power conditions, even for continuous cell charge-discharge cycles. This model also does not assume a particular chemistry and has proven to be robust for different chemistries involving a variety of open circuit potentials and battery design parameters. In one embodiment, the polynomials are in the region 0 to 1 such that globally convergent profiles can be obtained for any condition by increasing the number of terms in the series.

In one embodiment, further reformulations can be done to improve computation time by eliminating the need to numerically solve for the solid phase surface concentration while using the polynomial approximation for the solid phase. Once the remaining variables have been approximated by a series solution, it is possible to analytically solve for $c_{surf}$ in terms of these variables. First, the pore wall flux, $j_i$, can be determined from to give.

$$j_i = -5\frac{D_{solid,i}}{R_i}\left(C_i^{s,surf} - c_i^{s,avg}\right) \quad (11)$$

By inserting equation 11 into the physics model equations in Table 1, and solving for surface concentrations, the surface concentration may be understood in terms of average solid phase concentration and the solid phase potential. By solving for the surface concentration analytically in terms of other variables, one of the equations from each electrode can be eliminated, resulting in fewer DAEs that must be solved.

Figure 2:
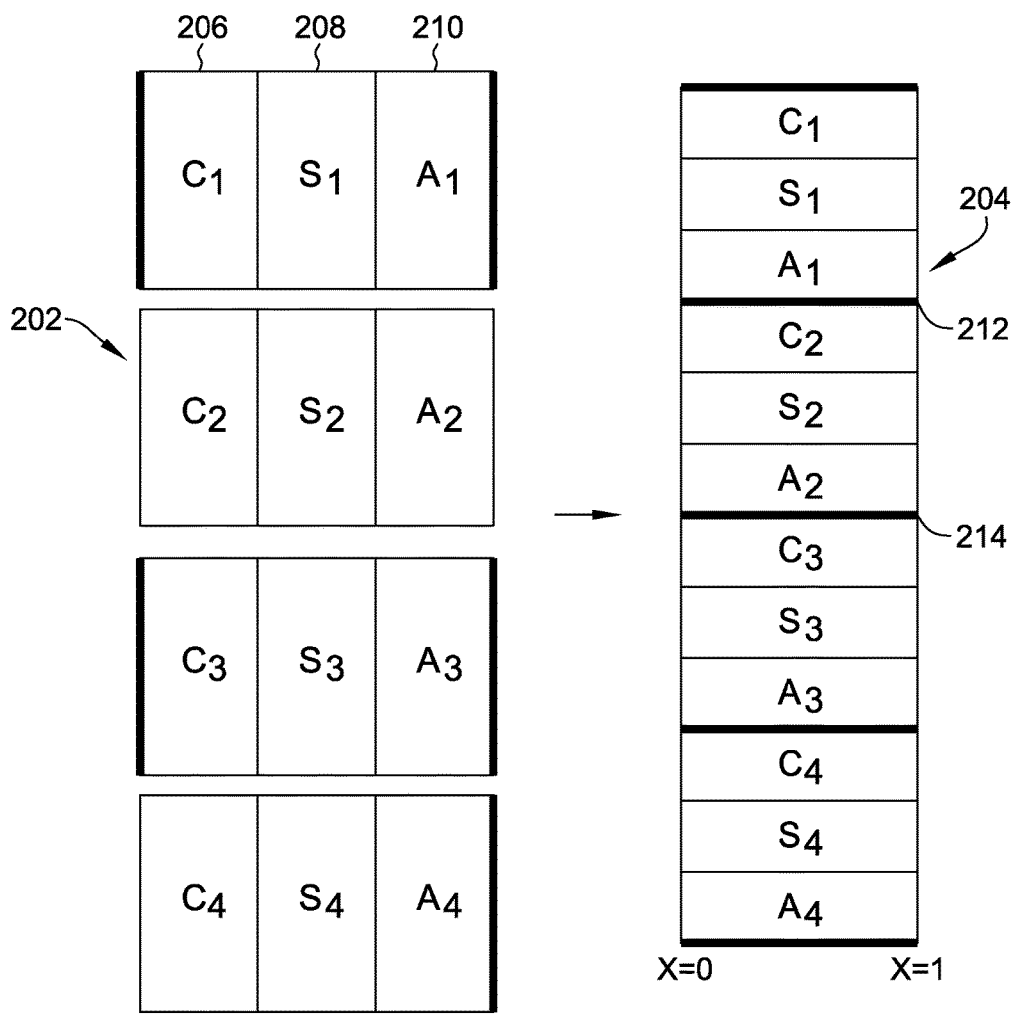
FIG. 2 is a schematic view of an exemplary battery cell stack being transformed from a standard model to a single region model to improve computational efficiency.

FIG. 2 is a schematic view of an exemplary battery cell stack 200 being transformed from an untransformed stack model 202 comprising a plurality of untransformed battery cells 102 (shown in FIG. 1) to a transformed stack model 204 to improve computational efficiency.

Each untransformed battery cell 102 comprises a positive region 206, a separator region 208, and a negative region 210. Current collectors 212, are formed between the plurality of untransformed battery cells 102 and at each end of stack 200. Current collectors 212 provide additional thermal mass to the system, which can slow the heating of the battery. Accordingly, in one embodiment, current collectors are included in transformed stack model 204.

conditions in a consistent manner in the battery stack. However, once this is accomplished, there is very little numerical difficulty in solving the resulting equations. Transformed stack model 200 may be used to determine an amount of current discharged by each cell 102, as well as the temperature of each cell 102. The additional equations governing thermal battery models are shown in TABLE IV below.

TABLE IV

Additional Governing Equations for Thermal Battery Model with Applied Temperature Boundary Conditions

| Governing Equation | Boundary Conditions |
|---|---|
| Positive Current Collector | |
| $\rho_{Al} C_{p,Al} \dfrac{\partial T_{Al}}{\partial t} = \dfrac{1}{l_{cc}} \dfrac{\partial}{\partial X}\left[\dfrac{\lambda_{Al}}{l_{cc}} \dfrac{\partial T_{Al}}{\partial X}\right] + \dfrac{i_{app}^2}{\sigma_{Al}}$ | $-\dfrac{\lambda_{Al}}{l_{Al}} \dfrac{\partial T_{Al}}{\partial X}\bigg\|_{X=1} = -\dfrac{\lambda_p}{l_p} \dfrac{\partial T_p}{\partial X}\bigg\|_{X=0}$ |
| | $-\dfrac{\lambda_{Al}}{l_{Al}} \dfrac{\partial T_{Al}}{\partial X}\bigg\|_{X=0} = -\dfrac{\lambda_p}{l_p} \dfrac{\partial T_p}{\partial X}\bigg\|_{X=0}$ |
| Positive Electrode | |
| $\rho_p C_{p,p} \dfrac{\partial T_p}{\partial t} = \dfrac{1}{l_p} \dfrac{\partial}{\partial X}\left[\dfrac{\lambda_p}{l_p} \dfrac{\partial T_p}{\partial X}\right] + Q_{rxn,p} + Q_{rev,p} + Q_{ohm,p}$ | $T_p\|_{X=0} = T_{Al}\|_{X=1}$ |
| | $-\dfrac{\lambda_p}{l_p} \dfrac{\partial T_p}{\partial X}\bigg\|_{X=1} = -\dfrac{\lambda_s}{l_s} \dfrac{\partial T_s}{\partial X}\bigg\|_{X=0}$ |
| Separator | |
| $\rho_s C_{p,s} \dfrac{\partial T_s}{\partial t} = \dfrac{1}{l_s} \dfrac{\partial}{\partial X}\left[\dfrac{\lambda_s}{l_s} \dfrac{\partial T_s}{\partial X}\right] + Q_{ohm,s}$ | $T_p\|_{X=1} = T_X\|_{X=0}$ $T_s\|_{X=0} = T_n\|_{X=1}$ |
| Negative Electrode | |
| $\rho_n C_{p,n} \dfrac{\partial T_n}{\partial t} = \dfrac{1}{l_n} \dfrac{\partial}{\partial X}\left[\dfrac{\lambda_n}{l_n} \dfrac{\partial T_n}{\partial X}\right] + Q_{rxn,n} + Q_{rev,n} + Q_{ohm,n}$ | $-\dfrac{\lambda_s}{l_s} \dfrac{\partial T_s}{\partial X}\bigg\|_{X=1} = -\dfrac{\lambda_n}{l_n} \dfrac{\partial T_n}{\partial X}\bigg\|_{X=0}$ |
| | $T_n\|_{X=1} = T_{Cu}\|_{X=0}$ |
| Negative Current Collector | |
| $\rho_{Cu} C_{p,Cu} \dfrac{\partial T_{Cn}}{\partial t} = \dfrac{1}{l_{Cu}} \dfrac{\partial}{\partial X}\left[\dfrac{\lambda_{Cu}}{l_{Cu}} \dfrac{\partial T_{Cu}}{\partial X}\right] + \dfrac{i_{app}^2}{\sigma_{Cu}}$ | $-\dfrac{\lambda_n}{l_n} \dfrac{\partial T_n}{\partial X}\bigg\|_{X=1} = -\dfrac{\lambda_{Cu}}{l_{Cu}} \dfrac{\partial T_{Cu}}{\partial X}\bigg\|_{X=0}$ |
| | $T_{Cu}\|_{X=1} = T_{app}$ |

The same orthogonal collocation and reformulation solution method presented above for the isothermal battery simulation was used for reformulation of the thermal model for a battery stack. The coordinate transformation described above makes it possible to add multiple cells to a stack. The inclusion of current collectors in the model increases the number of regions which are considered without a significant increase in the number of variables. A challenge in the transformation occurs because there is one more current collector than there are cells; there is not a one-to-one correspondence between the current collectors and cell sandwiches. The transformation is achieved by considering the current collectors as additional regions in which only the temperature variable is considered. The only other variable which is applicable in the current collector is the solid phase potential, which is assumed to be constant and equal to the end point potentials of the adjacent electrodes. The primary challenge arises in formulating the equations and boundary The approximate expressions for temperature were developed in the same way as the other variables and are given in Table V below. Both linear and quadratic terms are included in these approximate expressions in order to maintain generality so that various thermal boundary conditions can be used, such as constant temperature, constant flux, or convection, as well as continuity of temperature and of heat flux between the regions. Current collectors 212 are approximated in a similar manner. Current collectors 212 are constructed of highly conductive materials, such as copper and aluminum, the temperature does not vary significantly across current collectors 212, and no cosine terms are needed for an accurate approximation. A single constant term is adequate and must be solved for using the governing heat equation. The inclusion of current collectors 212 minimally increases the computational load, as only a small number of variables are added. For example, an eight-cell stack has two hundred and ninety eight DAEs that must be solved for if current collectors 212 are ignored. The example eight-cell stack has three hundred and seven DAEs when the temperature within the current collectors is considered.

TABLE V

Approximate Forms of Temperature Equations

Positive Current Collector $$T_{Al}(X, t) = A_{Al,T,1}(t)X + A_{Al,T,2}(t)X^2 + B_{Al,T}(t)$$

Positive Electrode $$T_p(X, t) = A_{p,T,1}(t)X + A_{p,T,2}(t)X^2 + \sum_{k=0}^{N_p} B_{p,T,k}(t)\cos(k\pi X)$$

Separator $$T_s(X, t) = A_{s,T,1}(t)X + A_{s,T,2}(t)X^2 + \sum_{k=0}^{N_s} B_{s,T,k}(t)\cos(k\pi X)$$

Negative Electrode $$T_n(X, t) = A_{n,T,1}(t)X + A_{n,T,2}(t)X^2 + \sum_{k=0}^{N_n} B_{n,T,k}(t)\cos(k\pi X)$$

Negative Current Collector $$T_{Cu}(X, t) = A_{Cu,T,1}(t)X + A_{Cu,T,2}(t)X^2 + B_{Cu,T}(t)$$

Model simulation of full battery stacks provides additional challenges which can be addressed by using this reformulation and orthogonal collocation followed by a numerical solution to solve the time dependence. It is necessary to consider a full multi-cell battery stack when thermal effects are included, as a temperature profile across the battery can affect cell performance. In the case of isothermal operation, each cell is exposed to the exact same conditions which cause each individual cell to behave identically. If this symmetry is broken, for instance by forcing a temperature gradient across the cell stack, the cells may behave differently from each other.

Battery stack 200 may include any number of battery cells 102 with any number of current collectors 212 between them. In at least one embodiment, current collectors 212 may be made of differing materials. For example, a first current collector 212 may be made of aluminum while a second current collector 212 may be made of copper. In the example embodiment, both electrodes at the end of the stack are negative electrode regions 210, and each successive cell reverses the order of the electrodes. In this configuration, the cells are connected in parallel so that the same voltage is applied at each cell 102. Therefore, if a constant current discharge is applied to battery stack 200, the current provided by each individual cell 102 may vary with time. At the boundaries between the electrodes and current collectors 212 the electrolyte concentration is considered to have zero flux, whereas the temperature and heat flux are continuous. Additionally, the solid phase potential drop between the anode 210 current collector 212 interface and the cathode 206 current collector 212 interface is the same across all cells 102. This couples the behavior of each cell 102, so that all cells 102 in stack 200 must be solved simultaneously. Because of the large number of equations that arise from the coupled thermal electrochemical multicell stack model, reformulation was performed to reduce the number of DAEs for efficient simulation.

In the example embodiment, the transformation from untransformed stack model 202 to transformed stack model 204 the alternating cell 102 sandwiches were treated differently. For the odd numbered cells 102 the model includes five regions: a first current collector 212, anode 206, separator 208, cathode 210, and a second current collector 212. The even numbered cells only consisted of the cathode 210, the separator 208, and the anode 206. Additionally, the odd numbered cells were flipped so that they were orientated in a cathode-separator-anode configuration so that all cells are consistent. A final current collector 212 (which is present regardless of the size of the stack) was considered independently of the individual cells.

This results in a system as shown in FIG. 2 for a 4-cell stack in which the positive electrode 206 for each cell is defined on the region $[0, 1_p]$, the separator 208 on the region $[1_p, 1_p+1_s]$, and the negative electrode 210 on the region $[1_p+1_s, 1_p+1_s+1_n]$. Current collectors 212, where applicable, are considered outside of this range. This simplifies the problem by eliminating the need to keep track of the location and orientation of each cell in the entire stack during simulation. The boundary conditions at each end of each cell 102 are determined by continuity. It must be noted that the application of the continuity of flux requires the direction of the flux to be reversed in adjacent cells to account for flipping every other cell 102 to achieve a consistent orientation. Once this is done, each cell 102 is transformed to a single transformed stack model 204. This reduces the entire stack to a single region defined from [0, 1], and the stack can be solved in the same way as described previously.

Figure 3:
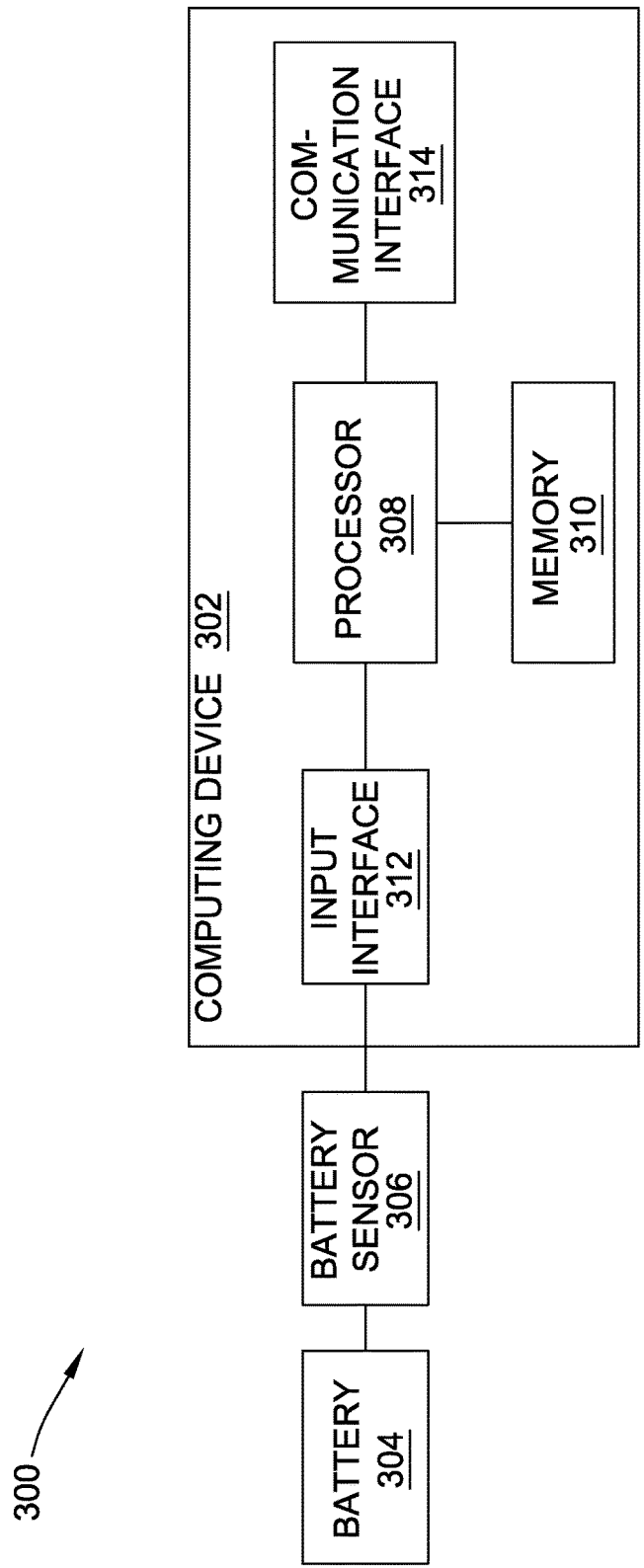
FIG. 3 is a schematic view of an exemplary battery system including a battery and a computing device communicatively coupled with a plurality of battery sensors for use in modeling the discharge of the battery.

FIG. 3 is a schematic view of an exemplary battery system 300 including a computing device 302 communicatively coupled with a plurality of battery sensors 306 that monitor parameters of battery 304. Computing device 302 is configured to model the amount of current discharged by at least one battery cell 102 (shown in FIG. 1) of battery 304.

In the exemplary embodiment, computing device 302 includes at least one processor 308 that is coupled to memory 310 for executing instructions. In some implementations, executable instructions are stored in memory 310. In the exemplary embodiment, computing device 302 performs one or more operations described herein by executing the executable instructions stored in memory 310. For example, processor 308 may be programmed by encoding an operation as one or more executable instructions in memory 310 and by providing the executable instructions from memory 310 to processor 308 for execution.

Processor 308 may include one or more processing units (e.g., in a multi-core configuration). Further, processor 308 may be implemented using one or more heterogeneous processor systems in which a main processor is present with secondary processors on a single chip. In another illustrative example, processor 308 may be a symmetric multi-processor system containing multiple processors of the same type. Further, processor 308 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein.

In the exemplary embodiment, memory 310 is one or more devices that enable information, such as executable instructions and/or other data, to be stored and retrieved. Memory 310 may include one or more computer readable media, such as, without limitation, dynamic random access memory (DRAM), static random access memory (SRAM), a solid state disk, and/or a hard disk. Memory 310 may be configured to store, without limitation, application source code, application object code, configuration data, battery data, and/or any other type of data.

In the exemplary embodiment, computing device 302 includes an input interface 312 that is coupled to processor 308. Input interface 312 is configured to receive input from at least one battery sensor 306. Input interface 312 may include, for example, an antenna, a wireless data port, a wired data port, or any other device capable of receiving data such that the methods and systems function as described herein.

Computing device 302, in the exemplary embodiment, includes a communication interface 314 coupled to processor 308. Communication interface 314 communicates with one or more devices, such as a user display, or battery 304. To communicate with remote devices, communication interface 314 may include, for example, a wired network adapter, a wireless network adapter, an antenna, and/or a mobile telecommunications adapter.

In the exemplary embodiment, battery sensor 306 senses ambient conditions relating to parameters of battery 304, such as, without limitation temperature around battery 304 and transmit the sensed information to computing device 302. Battery sensor 306 may be any device capable of sensing information related to battery 304 including, but not limited to, a photocell, a temperature gauge, a conductivity gauge, a porosity gage, a density gage, or any other device.

In the example embodiment, computing device 302 receives data from battery sensor 304 and generates a model of the battery 304 based, at least in part, on the received information. More specifically, computing device 302 is configured to generate a model of at least one battery cell 102 comprising a positive electrode region 106 (shown in FIG. 1), a negative electrode region 110 (shown in FIG. 1), and a separator region 108 (shown in FIG. 1). Computing device 302 is further configured to transform positive electrode region 106, negative electrode region 108, and separator region 110 of the battery into a single region 112 in the model. Computing device 302 is further configured to generate a plurality of trial functions associated with the single region, and determine the amount of current discharged from the battery cell based on the trial functions.

In the example embodiment, computing device 302 is further configured to determine the amount of current discharged by the battery cell using the collocation method as described above. In one embodiment, the computing device is further configured to determine amount of current discharged by battery cell 102 using a collocation method with a plurality of terms for each of positive electrode region 106, the negative electrode region 110, and the separator region 108.

Also, in the example embodiment, computing device 302 is further configured to generate a model for a plurality of battery cells 102 comprising a plurality of positive electrode regions 206, a plurality of negative electrode regions 210, and a plurality of separator regions 208 (all shown in FIG. 2). Computing device 302 may determine a temperature variation within the plurality of battery cells based on the determined amount of current discharged by each battery cell 102. Furthermore, computing device 302 may determine the discharge current from the battery cell over a plurality of battery cycling operations to differentiate the current discharge over time.

In at least one embodiment, computing device 302 includes a time adaptive solver, and the time adaptive solver is configured to determine the amount of current discharged by the battery cell. The primary advantage of this method is the speed of simulation, which arises because a fewer number of terms are required to obtain a converged solution. The simulation time when using various numbers of collocation points varies with increased time for more collocation points but with reduced root mean square error. Table VI below illustrates the amount of time required to perform various modeling methods and collocation term amounts.

TABLE VI

Simulation time and Root Mean Squared Error compared to FD.

| Method | Number of Differential Algebraic Equations | Simulation Time (Maple) (ms) | Simulation Time (DASSL) (ms) | RSME (mV) |
|---|---|---|---|---|
| Finite Difference (50, 35, 50) | 596 | N/A[a] | 4617 | — |
| Orthogonal Collocation (1, 1, 1) | 20 | 781 | 46 | 17.84 |
| Orthogonal Collocation (3, 2, 3) | 38 | 2355 | 78 | 5.46 |
| Orthogonal Collocation (5, 3, 5) | 56 | 6022 | 109 | 1.56 |
| Orthogonal Collocation (7, 3, 7) | 72 | 9882 | 156 | 0.57 |
| 1 C Rate MFD (7, 3, 7) Collocation | 136 | 28361 | 187 | 0.91 |
| 2 C Rate MFD (7, 3, 7) Collocation | 136 | 24686 | 172 | 6.18[b] |
| 5 C Rate MFD (9, 4, 9) Collocation | 170 | 38541 | 234 | 5.29[b] |
| 10 C Rate MFD (11, 4, 11) Collocation | 204 | 64381 | 250 | 9.42[b] |
| 8-Cell Thermal Electrochemical Coupled Stock | 307 | 668608 | 2449 | N/A[c] |

Figure 4:
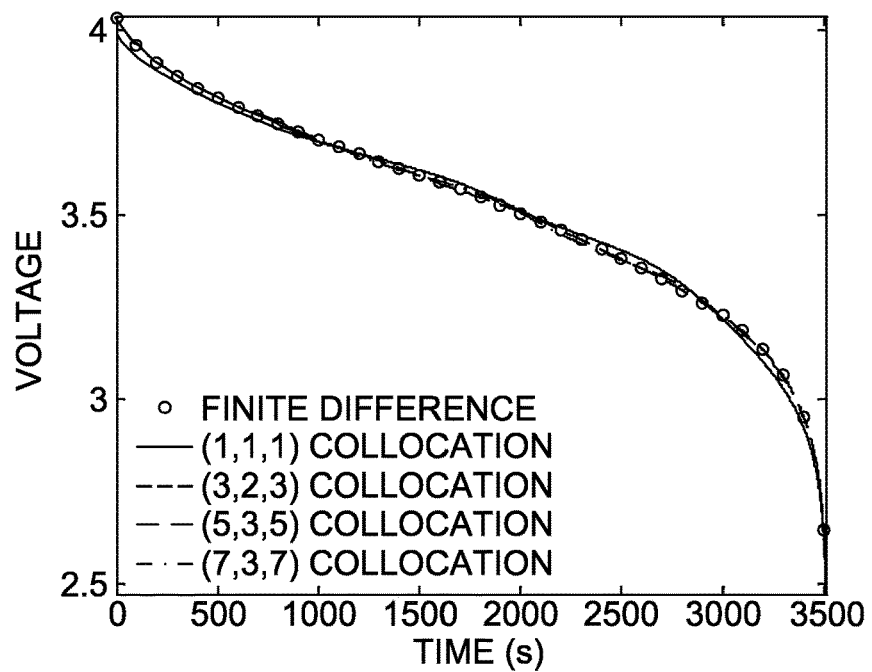
FIG. 4 is a graph illustrating a voltage-time curve for constant discharge of the battery shown in FIG. 3 in both transformed coordinates and in normal coordinates.

FIG. 4 is a graph illustrating a voltage-time curve for constant discharge of battery 304 (shown in FIG. 3) using collocation techniques as well as a finite difference technique. More specifically, in the illustrated embodiment the model prediction obtained using a collocation reformulation using a varying number of terms is compared to a full-order finite difference solution based on 50 node points in x for the electrodes and 35 node points for the separator. The primary curve of interest is the discharge graph in FIG. 4, which shows the full-order finite difference solution, as well as three solutions obtained using the orthogonal collocation approach for a 1 C rate of discharge. The least accurate collocation solution is obtained by using only one cosine term for each region, as shown by the dashed line in FIG. 4. Progressively more accurate solutions can be obtained by using orthogonal collocation with a greater number of terms. FIG. 4 also shows collocation solutions obtained using (3, 2, 3) terms (dotted line), (5, 3, 5) terms (dash-dot line), and (7, 3, 7) terms (solid line).

Note that the nomenclature, Np, Ns, Nn is used to represent the number of cosine terms used in positive electrode 106, separator 108, and negative electrode 110 (all shown in FIG. 1), respectively. The prediction of the internal variables established by the model enables a complete understanding of the lithium ion battery. Factors such as state of charge and state of health can be determined from this model to give a prediction of the future behavior and future life of a battery.

Figure 5:
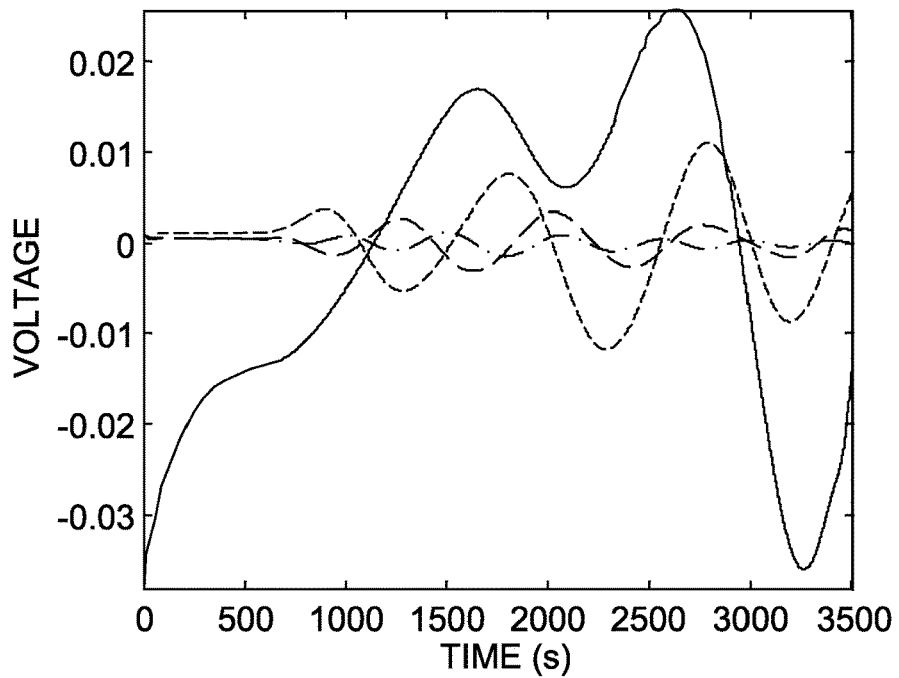
FIG. 5 is a graph of an example residual plot of a finite difference solution and a plurality of collocation solutions.

FIG. 5 shows the residuals of the orthogonal collocation solutions of the battery model shown in FIG. 4 relative to the finite difference solution. The least accurate collocation solution with the greatest residual is obtained by using only one cosine term for each region, as shown by the dashed line in FIG. 5. Progressively more accurate solutions with smaller variances in residual can be obtained by using orthogonal collocation with a greater number of terms. FIG. 5 also shows collocation residuals obtained using (3, 2, 3) terms (dotted line), (5, 3, 5) terms (dash-dot line), and (7, 3, 7) terms (solid line).

Figure 6:
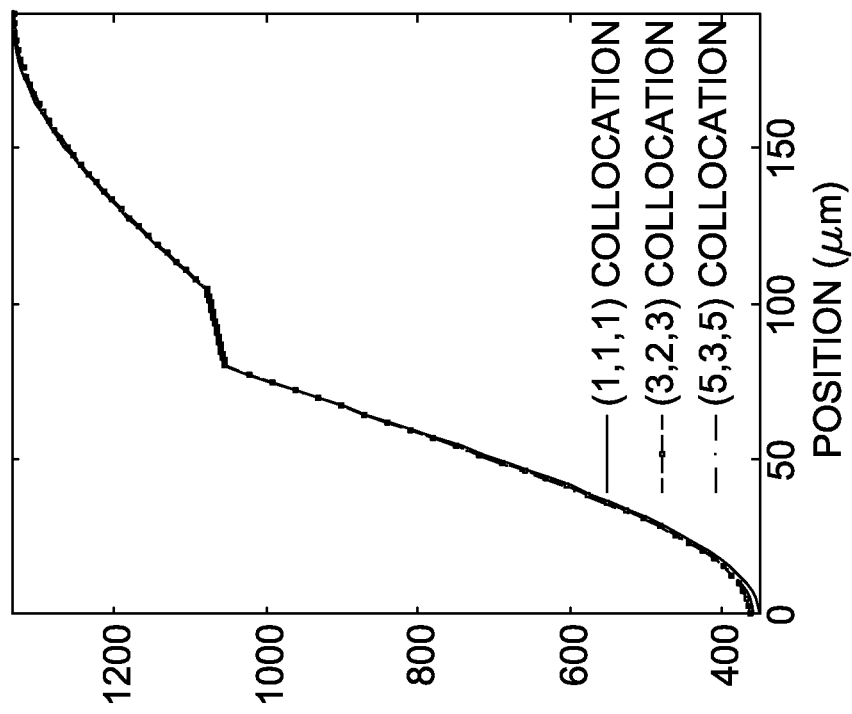
FIG. 6 is a pair of graphs illustrating electrolyte concentration across the battery for a variety of collocation techniques in both transformed and untransformed coordinates.
Figure 6:
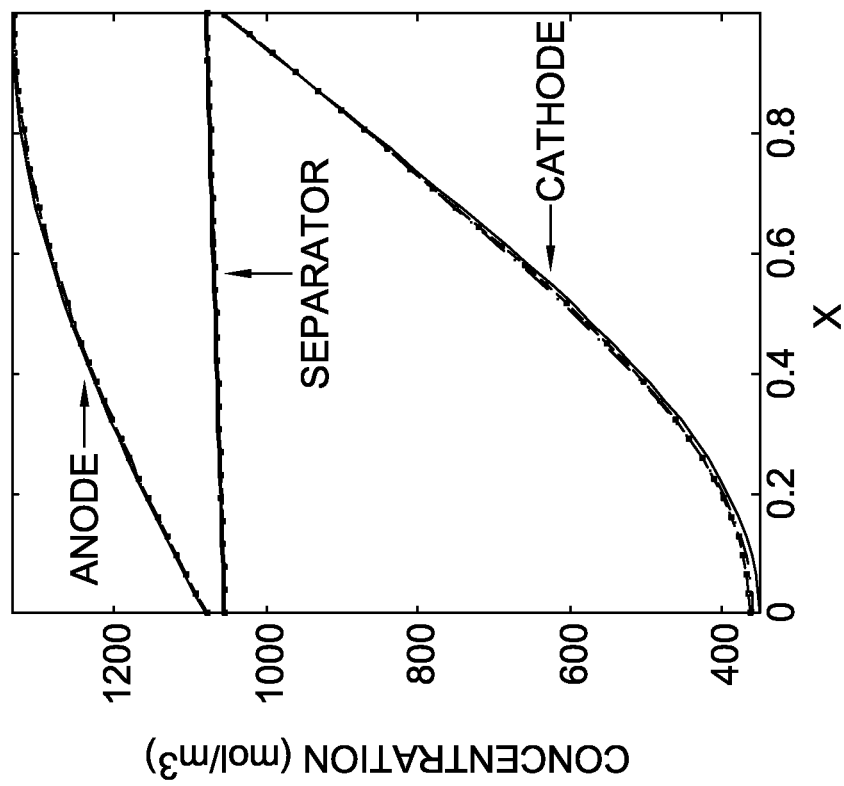

FIG. 6 is a pair of graphs illustrating electrolyte concentration across the battery for a variety of collocation techniques in both transformed and untransformed coordinates.

The concentration profile across the transformed domain (i.e. the cell is solved as a single region from 0 to 1) at the end of discharge is illustrated in the left graph. Once this is transformed back to the original domain, the concentration profile across the entire cell can be determined and is shown in the graph on the right. The average concentration of the lithium ions in the electrolyte solution must be conserved throughout the entire simulation. When the original equations are taken and averaged with the use of the boundary conditions (BCs), the mass is conserved. The collocation method presented here maintains this conservation, and there is no appreciable variation of average concentration with time.

In order to quantify convergence of the series, the maximum magnitude of the coefficients of successive terms must be analyzed. The first terms are dominant and that the system does converge. Interestingly, the later terms for describing the solid phase concentration carry more weight than for the other variables (although still significantly less than the first term). The behavior of the coefficients for the liquid phase concentration and potential in separator 108 are nearly completely determined by the constant term alone. In fact, the weight of this term is in excess of 99.99%.

Figure 7:
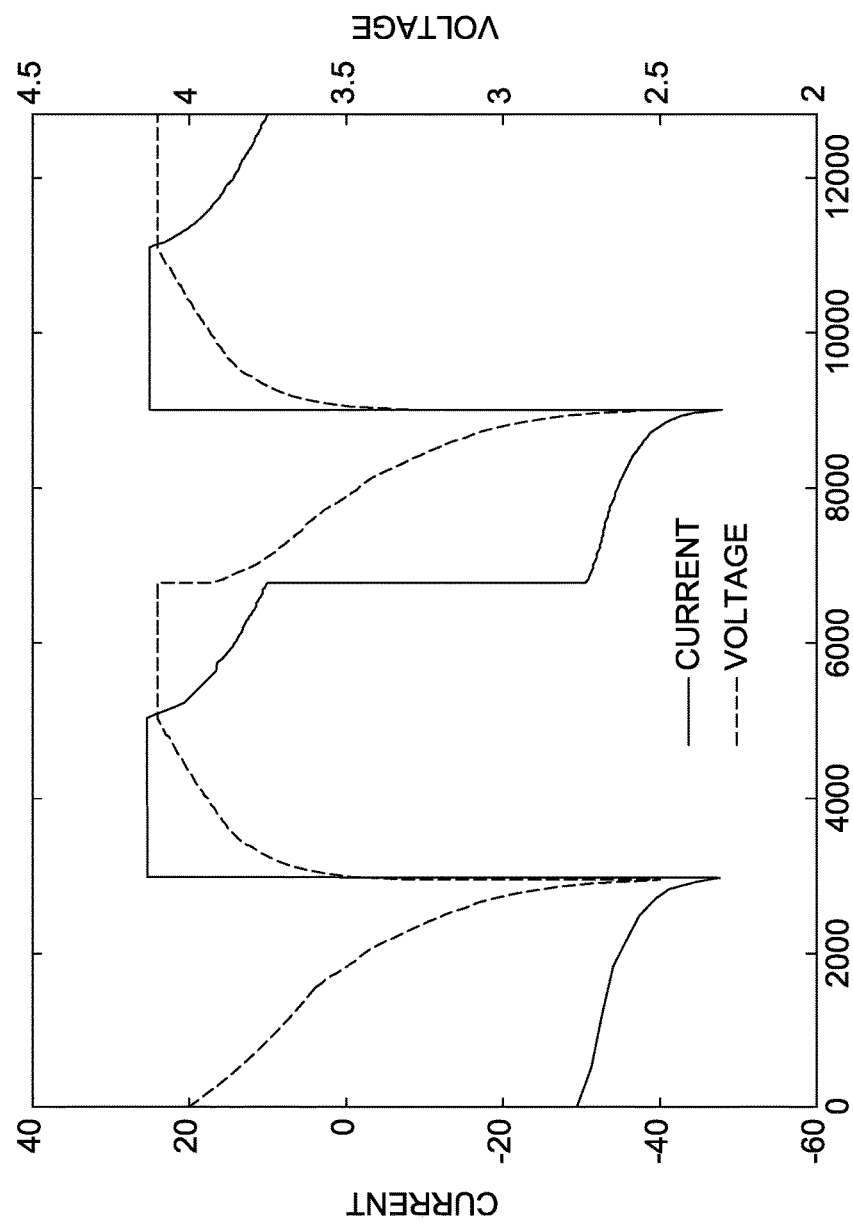
FIG. 7 is a graph that illustrates a Voltage-time and Current time curve for two continuous cycles consisting of constant power discharge followed by constant current charge and constant potential charge.

FIG. 7 is a graph that illustrates a Voltage-time and Current time curve for two continuous cycles consisting of constant power discharge followed by constant current charge and constant potential charge. More specifically, FIG. 7 shows two cycles which are subject to a constant power discharge of 120 W/m$^2$ a constant current charge of 25 A/m$^2$, followed by a constant current charge at 4.1 V. For comparison, a 1 C rate corresponds to ~30 A/m$^2$ using this chemistry. The current state of the internal variables within the battery is carried over from the end of each cycle to the next cycle. Because the internal variables change with time, the behavior of the battery during these cycles is not necessarily identical, perhaps due to incomplete charging of the battery. Also, the internal parameters, such as porosity, etc. can be made to change with cycle number. Therefore, as developments continue in the understanding of capacity fade this continuous cycling procedure can predict the future behavior of the battery by either changing the parameters already included, or by introducing additional parameters/mechanisms specifically to address capacity fade. This may be achieved by modifying the continuum model directly, or by coupling the continuum model with microscopic models, such as Kinetic Monte Carlo or Stress-Strain models to create a true multiscale model.

Figure 8:
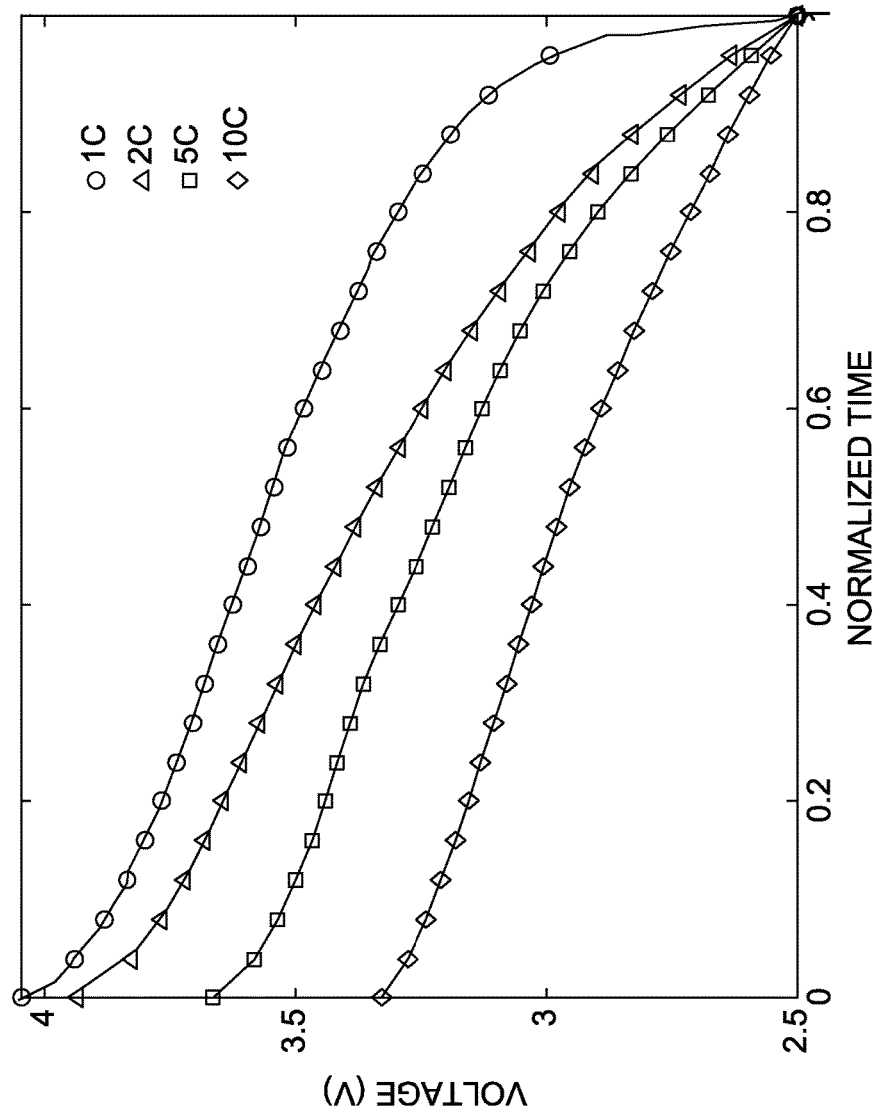
FIG. 8 is a graph that illustrates a discharge curve of the battery cell shown in FIG. 1 for higher discharge rates.

FIG. 8 is a graph that illustrates a discharge curve of the battery cell shown in FIG. 1 for higher discharge rates. This method can also be used when higher rates of discharge are applied, however, in those circumstances, it is necessary to use the mixed finite difference approximation for the solid phase concentration, instead of a parabolic profile. The basic method presented for reformulation in the x-direction, however, is valid for both parabolic profile approximation and for the mixed finite difference approach. Accordingly, the remainder of the method remains the same.

Figure 9:
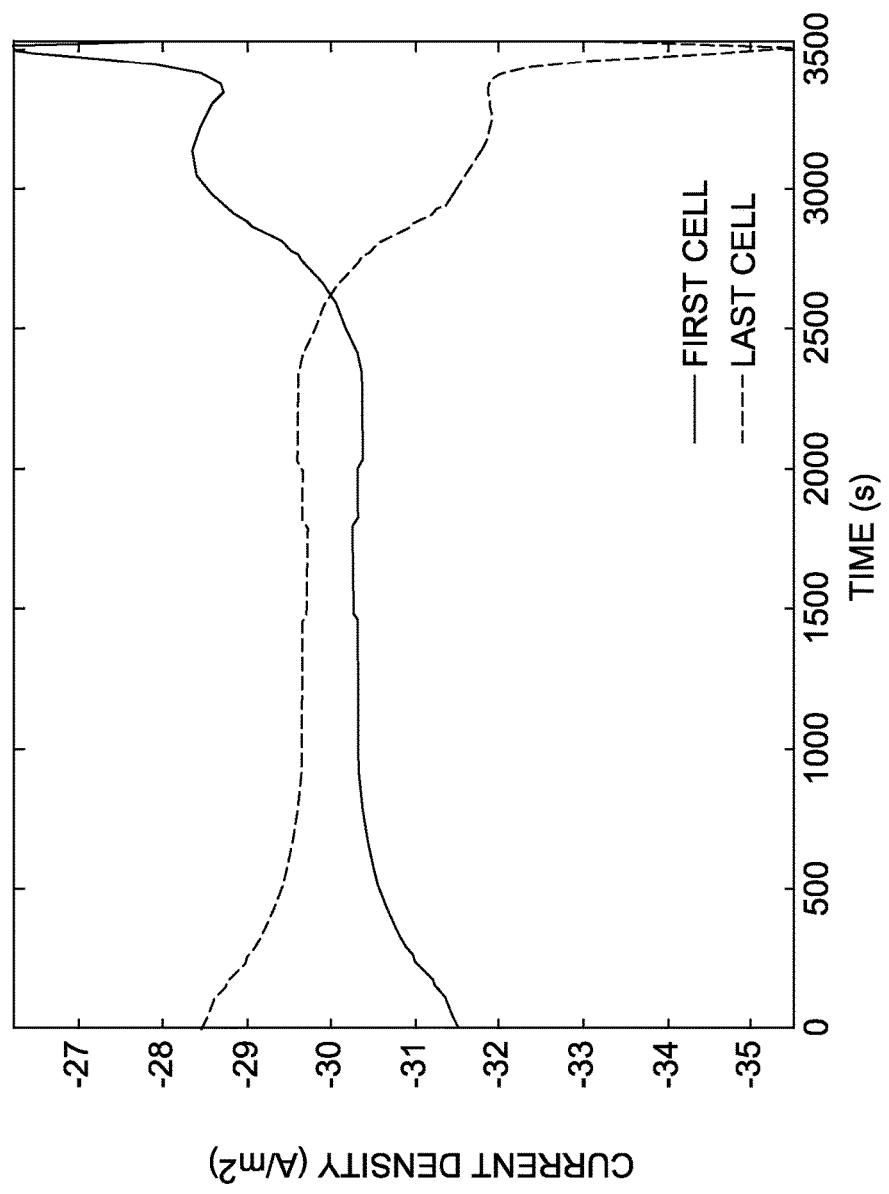
FIG. 9 is a graph of current-time curves for the first cell and last cell within an 8-cell stack with an applied temperature gradient undergoing constant current discharge using the coupled thermal electrochemical model.

FIG. 9 is a graph of current-time curves for the first cell and last cell within an 8-cell stack with an applied temperature gradient undergoing constant current discharge using the coupled thermal electrochemical model. Expanding the model to include the effects of temperature in a multiple cell stack can allow for more detailed simulation, albeit at an increased computational cost. The temperature rises at the center of the battery during operation, and when the battery has sufficiently high temperature coefficients, the possibility of creating a hotspot becomes more significant. In the illustrated embodiment, the current provided by the individual cells are not identical throughout discharge because the temperature of each end of the multi-cell stack is fixed to create temperature decrease of 10 K across the battery. This causes the individual cells to behave differently, resulting in the subtly different curves shown in FIG. 9. The higher temperature of the first cell causes it to initially discharge at a faster rate than the last cell. However, by the end of discharge, the cooler cell provides a greater current because it exists at a greater state of charge.

Figure 10:
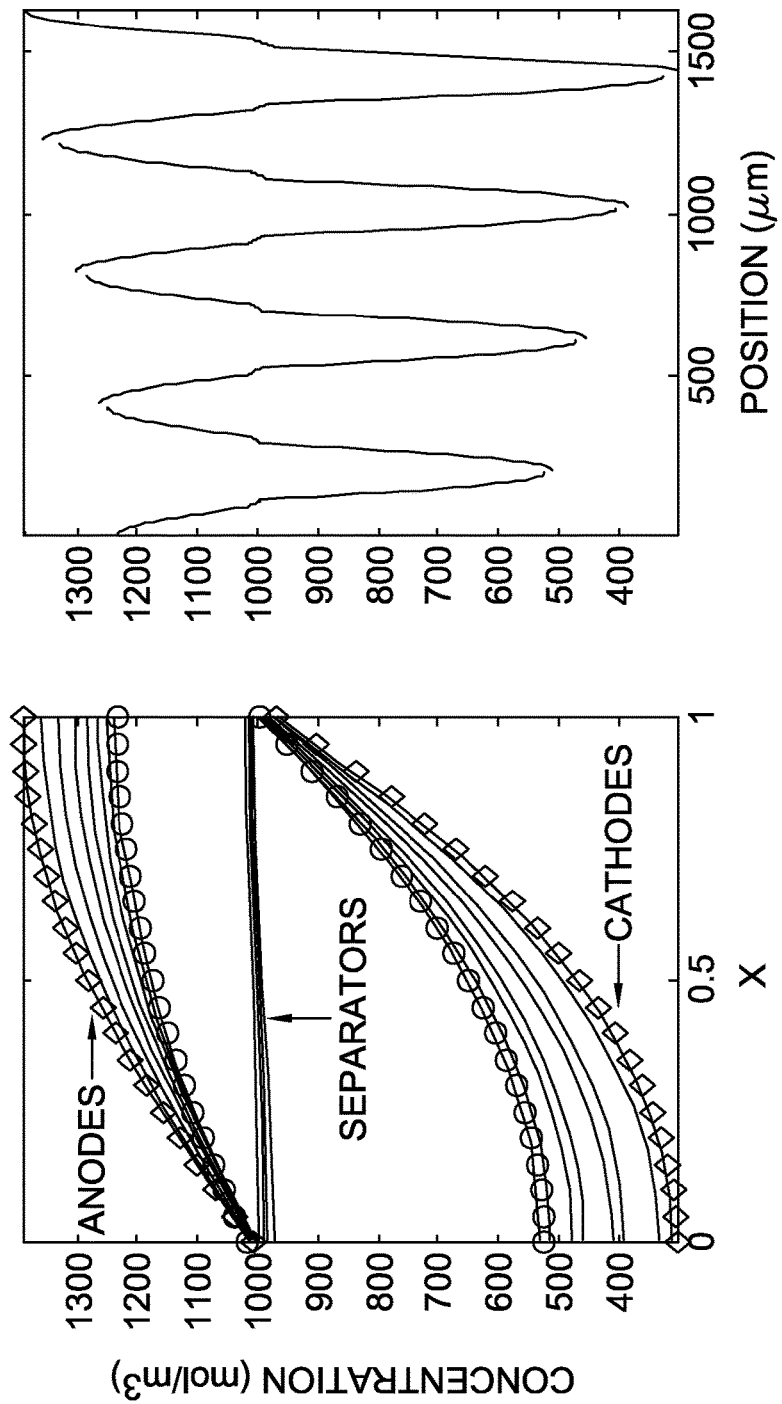
FIG. 10 is a pair of graphs illustrating electrolyte concentration across the 8-cell stack at the end of discharge in both transformed and untransformed coordinates.

FIG. 10 is a pair of graphs illustrating electrolyte concentration across the 8-cell stack at the end of discharge in both transformed and untransformed coordinates. FIG. 10 shows the concentration profile across the entire battery in the transformed coordinates for each individual cell in the left graph, which further demonstrates how temperature can affect internal battery characteristics. The right graph of FIG. 10 shows the concentration profile across the entire stack in natural coordinates at the end of discharge. In the example embodiment, there is no electrolyte in the region of the current collectors, leading to a discontinuity at those points. In the illustrated embodiment, the stack is sufficiently small that internal heat generation effects do not significantly alter the temperature profile when the ends are held at a fixed temperature. However, for larger stacks, higher applied current and/or different boundary conditions, the temperature profile may be significantly affected by internal heat generation leading to greater behavior variations among the individual cells without an arbitrarily forced condition. The other spatial directions, y and z, are important for thermal models at high rates, and the coordinate transformation and the orthogonal collocation approach is still valid. A detailed pseudo 4D model (x, y, z and r) in stack environment can be reduced to a unit cell of X, Y, Z varying from 0 to 1 in dimensionless transformed coordinates as explained earlier. The proposed approach is also useful for developing models for optimization of graded electrodes or materials wherein control vector parameterization converts a given single region to N regions to represent discrete functions of porosity, particle size or shape.

Figure 11:
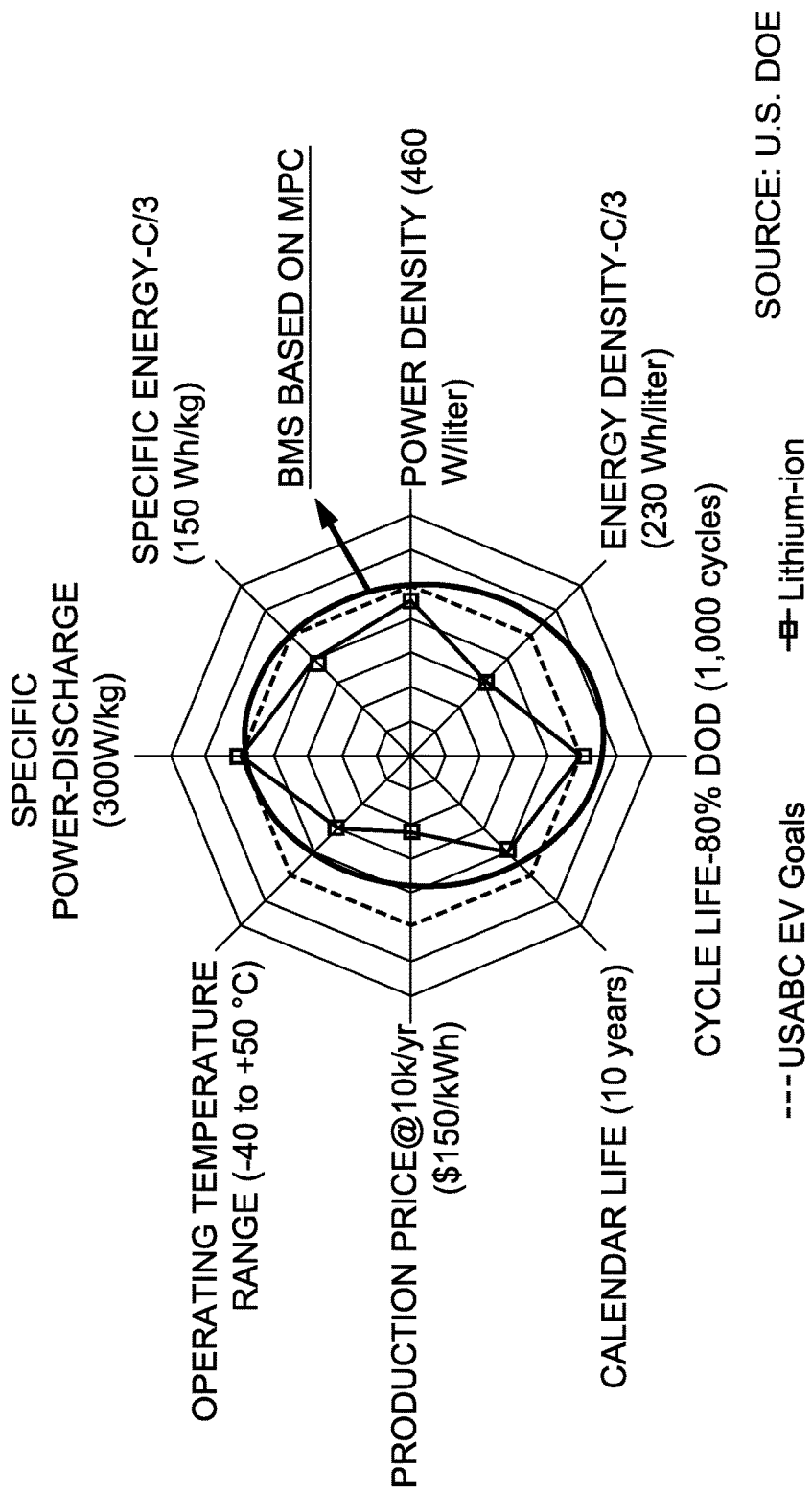
FIG. 11 is a graph of an example specific power-discharge for an example battery utilizing a battery management system as shown in FIG. 3.

FIG. 11 is a graph of an example specific power-discharge for an example battery utilizing a battery management system as shown in FIG. 3. As can be seen a battery management system using the above described modeling method may vastly improve battery operations.

In the embodiments described above, a coordinate transformation and reformulation of the porous electrode pseudo 2-D model for lithium-ion battery stacks was developed and presented that could be solved accurately and quickly. The coordinate transformation was used to rescale the three regions of the battery model into a single region evaluated on the interval zero to one. This allows collocation to be applied using the zeros of the Jacobi polynomials. This leads to the ability to analytically solve for certain variables prior to using any numerical solver. This results in a system of fewer DAEs which allows for easier (and quicker) computation compared to the traditional finite difference approach.

The reformulation presented is robust enough to be used for a variety of conditions with limited assumptions to maintain the most accurate physics of the model. Although only a single battery chemistry is shown here, this method has been used successfully for a number of different chemistries across a wide range of transport and kinetic parameters. This model thus allows an efficient battery model simulation for use in control and optimization routines, as well as for parameter estimation. Efficient simulation is essential for optimization and parameter estimation because of the large number of simulations that must be run to converge to an appropriate solution. Future work will focus on refining the stack model to allow for simulation of larger stacks, while accounting for multi-scale effects and capacity fade. Additionally, this model will be used in conjunction with optimization routines for lithium-ion battery electrode design to improve performance. The addition of Arrhenius type dependence of diffusion coefficients and reaction rate constants on temperature was also included. This increases the fidelity of the model at the expense of increased complexity and computation time. This approach is robust enough to solve these equations faster than if a finite difference approach were used. This is especially pronounced when a coupled thermal electrochemical multi-cell stack model is used due to the large number of equations that must be solved. However, such a stack model better describes how individual cells operate in the context of a full battery stack. This is important when thermal or other effects cause the individual cells to operate differently from each other. Since it is often not practical or possible to measure each cell individually in a stack, these differences can lead to potentially dangerous or damaging conditions such as overcharging or deep-discharging certain cells within the battery causing thermal runaway or explosions. The ability to efficiently simulate battery stacks facilitates monitoring of individual cell behavior during charging and discharging operations and thereby reducing the chances of temperature buildup causing thermal runaway making the use of stacks safer.

Although specific features of various embodiments may be shown in some drawings and not in others, this is for convenience only. Any feature of a drawing may be referenced and/or claimed in combination with any feature of any other drawing.

As will be appreciated based on the foregoing specification, the above-described embodiments of the disclosure may be implemented using computer programming or engineering techniques including computer software, firmware, hardware or any combination or subset thereof, wherein the technical effect is for (a) generating, by the computing device, a model of at least one battery cell comprising a positive electrode region, a negative electrode region, and a separator region; (b) transforming the positive electrode region, the negative electrode region, and the separator region of the battery into a single region in the model; (c) generating, by the computing device, a plurality of trial functions associated with the single region; and (d) determining, by the computing device, the amount of current discharged from the battery cell based on the trial functions.

This written description uses examples to describe the embodiments of the disclosure, including the best mode, and also to enable any person skilled in the art to practice the systems and methods described herein, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method for modeling the amount of current discharged by a battery, the method implemented by a computing device communicatively coupled with a memory, the method comprising:
   receiving, from a battery sensor, measured parameters associated with the battery;
   generating, by the computing device, a model of at least one battery cell comprising a positive electrode region, a negative electrode region, and a separator region based on the received measured parameters;
   transforming the positive electrode region, the negative electrode region, and the separator region of the battery into a single region in the model region by a coordinate transformation combined with an orthogonal collocation;
   generating, by the computing device, a plurality of functions associated with the single region;
   determining, by the computing device, the amount of current discharged from the battery cell based on the functions; and
   adjusting operation of a hybrid environment of the battery based on the amount of current discharged.

2. The method of claim 1, wherein the method further comprises determining the amount of current discharged by the battery cell using a collocation method.

3. The method of claim 2, wherein the method further comprises determining the amount of current discharged from the battery cell using a collocation method with a plurality of terms for each of the positive electrode region, the negative electrode region, and the separator region.

4. The method of claim 1, wherein the generating a model of the at least one battery cell further comprises generating a model of a plurality of battery cells comprising a plurality of positive electrode regions, a plurality of negative electrode regions, and a plurality of separator regions.

5. The method of claim 3, further comprising determining a temperature variation within the plurality of battery cells based on the determined discharge current of each battery cell.

6. The method of claim 1 wherein transforming the positive region, the negative region, and the separator region into a single region further comprises transforming the spatial length of each region into a dimensionless value and setting the single region to be between 0 and 1.

7. The method of claim 1, further comprising determining the discharge current from the battery cell over a plurality of battery cycling operations.

8. The method of claim 1, wherein determining the discharge current from the battery cell further comprises determining with the discharge current using a time adaptive solver.

9. A computing device for modeling the discharge current from a battery, the computing device comprising a memory and a processor communicatively coupled to the memory, wherein the processor is configured to:
   receive, from a battery sensor, measured parameters associated with the battery;
   generate a model of at least one battery cell comprising a positive electrode region, a negative electrode region, and a separator region based on the received measured parameters;

transform the positive electrode region, the negative electrode region, and the separator region into a single region by a coordinate transformation combined with an orthogonal collocation;

generate a plurality of functions associated with the single region;

determine the amount of current discharged from the battery cell based on the functions; and adjust operation of a hybrid environment of the battery based on the amount of current discharged.

10. The computing device of claim 9, wherein the processor is further configured to determine the amount of current discharged by the battery cell using a collocation method.

11. The computing device of claim 10, wherein the computing device is further configured to determine the discharge current from the battery cell using a collocation method with a plurality of terms for each of the positive electrode region, the negative electrode region, and the separator region.

12. The computing device of claim 9, wherein the processor is further configured to generate a model for a plurality of battery cells comprising a plurality of positive electrode regions, a plurality of negative electrode regions, and a plurality of separator regions.

13. The computing device of claim 12, wherein the processor is further configured to determine a temperature variation within the plurality of battery cells based on the determined amount of current discharged by each battery cell.

14. The computing device of claim 9, wherein the processor is further configured to determine the discharge current from the battery cell over a plurality of battery cycling operations.

15. The computing device of claim 9, wherein the processor further comprises a time adaptive solver, and the time adaptive solver is configured to determine the amount of current discharged by the battery cell.

16. A battery management system for improving performance of a battery, wherein the battery management system comprises:

a battery comprising at least one battery cell;

a battery sensor coupled to the battery and configured to measure parameters associated with the battery; and a computing device communicatively coupled with the battery sensor, wherein the computing device is configured to:

receive, from the battery sensor, measured parameters associated with the battery;

generate a model of at least one battery cell comprising a positive electrode region, a negative electrode region, and a separator region based on the received measured parameters;

transform the positive electrode region, the negative electrode region, and the separator region into a single region by a coordinate transformation combined with an orthogonal collocation;

generate a plurality of functions associated with the single region;

determine the amount of current discharged from the battery cell based on the functions; and adjust operation of a hybrid environment of the battery based on the amount of current discharged.

17. The battery management system of claim 16, wherein the computing device is further configured to determine the amount of current discharged by the battery cell using a collocation method.

18. The battery management system of claim 16, wherein the computing device is further configured to generate a model for a plurality of battery cells comprising a plurality of positive electrode regions, a plurality of negative electrode regions, and a plurality of separator regions.

19. The battery management system of claim 16, wherein the computing device is further configured to determine the discharge current from the battery cell over a plurality of battery cycling operations.

20. The battery management system of claim 16, wherein the computing device further comprises a time adaptive solver, and the time adaptive solver is configured to determine the amount of current discharged by the battery cell.

* * * * *